US009525411B2

(12) United States Patent
Richardson et al.

(10) Patent No.: US 9,525,411 B2
(45) Date of Patent: Dec. 20, 2016

(54) POWER SUPPLY CIRCUITS FOR GATE DRIVERS

(71) Applicant: Analog Devices, Inc., Norwood, MA (US)

(72) Inventors: Kenneth G. Richardson, Erie, CO (US); Ryan Schnell, Longmont, CO (US)

(73) Assignee: Analog Devices, Inc., Norwood, MA (US)

(*) Notice: Subject to any disclaimer, the term of this patent is extended or adjusted under 35 U.S.C. 154(b) by 98 days.

(21) Appl. No.: 14/540,762

(22) Filed: Nov. 13, 2014

(65) Prior Publication Data

US 2016/0142049 A1   May 19, 2016

(51) Int. Cl.
*G06F 1/26*       (2006.01)
*H03K 17/687*     (2006.01)
(Continued)

(52) U.S. Cl.
CPC ............. *H03K 17/687* (2013.01); *H02M 1/08* (2013.01); *H02M 1/088* (2013.01); *H02M 2001/0006* (2013.01)

(58) Field of Classification Search
CPC .............................. H03K 17/687; H02M 1/088
(Continued)

(56) References Cited

U.S. PATENT DOCUMENTS 6,222,744 B1 * 4/2001 Pernyeszi ............. H02M 7/538
363/41

6,531,895 B1 * 3/2003 Barrett ................. H03K 17/063
326/82

(Continued)

FOREIGN PATENT DOCUMENTS

CN    103368362 A    10/2013

OTHER PUBLICATIONS

Brian Kennedy, "Implementing an Isolated Half-Bridge Gate Driver", Analog Dialogue, Nov. 4, 2012, vol. 46, No. 4, pp. 10-12.
(Continued)

*Primary Examiner* — Vincent Tran
(74) *Attorney, Agent, or Firm* — Wolf, Greenfield & Sacks, P.C.

(57) ABSTRACT

An embodiment of a power supply circuit to generate a supply voltage for a gate driver circuit can include an isolated power supply circuit to receive a first voltage in a first isolated system and provide power to a cyclic charging power supply circuit, the cyclic charging power supply circuit providing a supply voltage to the gate driver circuit in a second isolated system, the isolated power supply circuit providing the power to the cyclic charging power supply circuit while the gate driver circuit drives a transistor in an on state. The isolated power supply circuit can include a control circuit to regulate the power provided to maintain or increase the supply voltage while the gate driver circuit drives the transistor in an on state. The power supply circuit can also include the cyclic charging power supply circuit to receive a second voltage in the second isolated system and provide the supply voltage to the gate driver circuit. The cyclic charging power supply circuit can include one or more of a bootstrap power supply circuit or a charge pump power supply circuit.

22 Claims, 4 Drawing Sheets

(51) Int. Cl.
*H02M 1/088* (2006.01)
*H02M 1/08* (2006.01)
*H02M 1/00* (2006.01)

(58) Field of Classification Search
USPC .......................................................... 713/323
See application file for complete search history.

(56) References Cited

U.S. PATENT DOCUMENTS

| | | | |
|---|---|---|---|
| 6,812,782 | B2 | 11/2004 | Grant |
| 7,046,040 | B2 | 5/2006 | Guedon |
| 7,449,259 | B2* | 11/2008 | Zhu .................... B60L 11/1887 |
| | | | 429/422 |
| 7,558,080 | B2 | 7/2009 | Chen et al. |
| 7,613,016 | B2 | 11/2009 | Chen et al. |
| 7,719,305 | B2 | 5/2010 | Chen |
| 7,965,522 | B1* | 6/2011 | Hornberger ............. H02M 1/08 |
| | | | 363/21.1 |
| 7,983,059 | B2 | 7/2011 | Chen |
| 8,564,978 | B2 | 10/2013 | Keller |
| 8,723,490 | B2 | 5/2014 | Moussaoui et al. |
| 8,749,277 | B2 | 6/2014 | Kenney |
| 8,829,955 | B1 | 9/2014 | Goswami |
| 2002/0126513 | A1* | 9/2002 | Negru ................. H02M 3/33592 |
| | | | 363/25 |
| 2008/0290841 | A1 | 11/2008 | Chang et al. |
| 2011/0074486 | A1* | 3/2011 | Hou ...................... H03F 1/0244 |
| | | | 327/333 |
| 2011/0096451 | A1* | 4/2011 | Owens ................. H03K 17/567 |
| | | | 361/160 |
| 2011/0242858 | A1 | 10/2011 | Strzalkowski |
| 2012/0099345 | A1 | 4/2012 | Zhao et al. |
| 2012/0235663 | A1* | 9/2012 | Bayerer ................ H02M 1/088 |
| | | | 323/311 |
| 2013/0106374 | A1 | 5/2013 | Ball |
| 2013/0214757 | A1 | 8/2013 | Lee et al. |
| 2013/0279611 | A1 | 10/2013 | Mueck et al. |
| 2015/0115718 | A1* | 4/2015 | Yoshida .................. H02M 3/06 |
| | | | 307/63 |
| 2016/0011242 | A1* | 1/2016 | Seeman ................... G01R 1/30 |
| | | | 324/686 |

OTHER PUBLICATIONS

Analog Devices, Inc., "Design Fundamentals of Implementing an Isolated Half-Bridge Gate Driver", Technical Article MS-2318, May 2012, 4 pages.
International Rectifier, "High and Low Side Driver", Data Sheet No. PD60147 rev.U, IR2110(-1-2)(S)PbF/IR2113(-1-2) (S)PbF, Mar. 23, 2005, 18 pages.
Analog Devices, Inc., "H-Bridge Driver Circuit Using Isolated Half-Bridge Drivers", Circuit Note CN-0196, 2011, 6 pages.
Analog Devices, Inc., "Isolated Half-Bridge Driver with Integrated High-Side Supply", Data Sheet ADuM5230, 2008-2013, 16 pages.
Analog Devices, Inc., "Dual-Channel Isolators with Integrated DC-to-DC Converters", Data Sheet ADuM5210/ADuM5211/ADuM5212, 2013, 24 pages.
Analog Devices, Inc., "Isolated Precision Half-Bridge Driver, 4 A Output", Data Sheet ADuM3223/ADuM4223, 2012-2014, 20 pages.
Analog Devices, Inc., "Isolated Switching Regulator with Quad-Channel Isolators", Data Sheet ADuM4470/ADuM4471/ADuM4472/ADuM4473/ADuM4474, 2012, 36 pages.
Allegro MicroSystems, LLC, "Half-Bridge Power MOSFET Controller", A3946, 2003-2013, 14 pages.
Baoxing Chen, "Integrated Signal and Power Isolation Provide Robust and Compact Measurement and Control", Technical Article MS-2511, 2013, 5 pages.
Baoxing Chen, "Isolated Half-Bridge Gate Driver with Integrated High-Side Supply", Power Electronics Specialists Conference, IEEE, 2008, pp. 3615-3618.

\* cited by examiner

POWER SUPPLY CIRCUITS FOR GATE DRIVERS

BACKGROUND INFORMATION

Load driving circuits are used to drive loads in a variety of applications, such as within polyphase systems to drive electric motors. Many such load driving applications necessitate galvanic or other forms of isolation between the load system and another system delivering power, control and data inputs. Isolation is typically necessitated for a variety of reasons, including safety and reliability concerns associated with higher voltage levels present in the load system.

In one form, a load driving circuit can include a half bridge circuit having a pair of NMOS power transistors connected to the load at respective source and drain terminals to provide corresponding high and low side driving. Using NMOS transistors to provide both high and low side driving can be advantageous due to the typically lower on resistance, higher power capability, and faster switching of NMOS transistors in comparison to PMOS transistors. However, using NMOS transistors to provide high side driving creates the need to provide a functionally isolated or electrically floating supply voltage to a gate driver driving the high side NMOS transistor, as the source of the NMOS transistor is connected to the load.

One difficulty in providing an electrically floating supply voltage to a high side gate driver is that the gate driver draws energy from the source of the supply voltage while driving the load, potentially decreasing the supply voltage to levels that impact the performance of the gate driver itself. Another difficulty is that initializing the electrically floating supply voltage has typically required an undesirably prolonged startup sequence involving the low side gate driver.

Therefore, a need exists for an improved power supply circuit to deliver isolated and/or electrically floating supply voltages to load driving circuits.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 3(b) is a signal diagram depicting another embodiment of an output signal of a gate driver circuit.

FIG. 3(c) is a signal diagram depicting an embodiment of a supply voltage of an unaugmented bootstrap power supply circuit.

FIG. 3(d) is a signal diagram depicting an embodiment of a supply voltage of the augmented power supply circuit.

FIG. 3(e) is a signal diagram depicting another embodiment of the supply voltage of the augmented power supply circuit.

FIG. 3(f) is a signal diagram depicting another embodiment of the supply voltage of the augmented power supply circuit.

FIG. 3(g) is a signal diagram depicting another embodiment of the supply voltage of the augmented power supply circuit.

FIG. 4(b) is a signal diagram depicting another embodiment of an output signal of a gate driver circuit.

FIG. 4(c) is a signal diagram depicting another embodiment of a supply voltage of an unaugmented bootstrap power supply circuit.

FIG. 9 is a schematic diagram depicting an embodiment of a system having the augmented power supply circuit and a single-switch load driving circuit.

FIG. 10 is a schematic diagram depicting another embodiment of a system having the augmented power supply circuit and a single-switch load driving circuit.

DETAILED DESCRIPTION OF EXAMPLE EMBODIMENTS

An embodiment of a power supply circuit to generate a supply voltage for a gate driver circuit can include an isolated power supply circuit to receive a first voltage in a first isolated system and provide power to a cyclic charging power supply circuit, the cyclic charging power supply circuit providing a supply voltage to the gate driver circuit in a second isolated system, the isolated power supply circuit providing the power to the cyclic charging power supply circuit while the gate driver circuit drives a transistor in an on state.

The isolated power supply circuit can include a control circuit to regulate the power provided so as to maintain or increase the supply voltage provided by the cyclic charging power supply circuit while the gate driver circuit drives the transistor in the on state. The control circuit may regulate the power supplied to maintain or increase the supply voltage while the gate driver drives the transistor in the on state by one or more of: limiting a current supplied by the isolated power supply circuit to the cyclic charging power supply circuit to a current level below a predetermined level; limiting the supply voltage controlled by the isolated power supply circuit to a voltage at a predetermined voltage level below a peak supply voltage level provided by the cyclic charging power supply circuit; limiting the power provided by the isolated power supply circuit to below a predetermined substantially constant power level; limiting the power provided as a function of a temperature of the isolated power supply; selecting an impedance connecting the isolated power supply circuit to the cyclic charging power supply circuit.

The power supply circuit can also include the cyclic charging power supply circuit. The cyclic charging power supply circuit may receive a second voltage in the second isolated system and provide an electrically floating supply voltage to the gate driver circuit while the gate driver circuit drives the transistor in the on state. The cyclic charging power supply circuit can include one or more of a bootstrap power supply circuit or a charge pump power supply circuit.

The isolated power supply may supply power to the bootstrap power supply circuit to initially charge a capacitor of the bootstrap power supply circuit upon startup or reset of the power supply circuit. The isolated power supply may supply this power to initially charge the capacitor of the bootstrap power supply while gate drivers for driving a load circuit are inactive.

Figure 1:
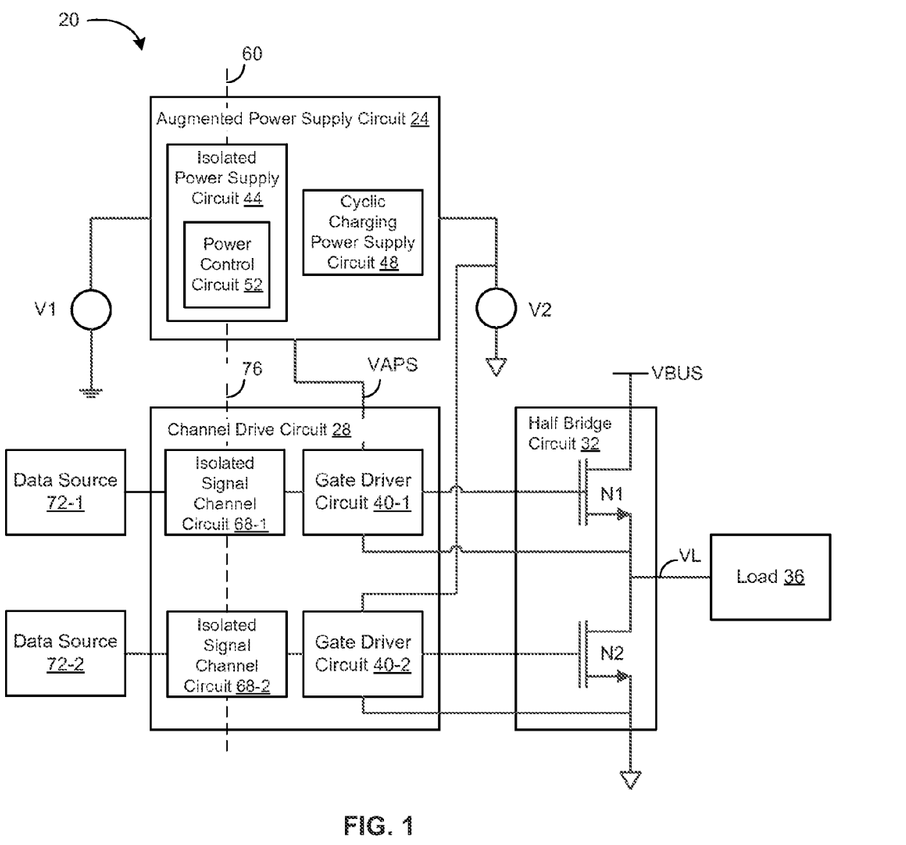
FIG. 1 is a schematic diagram depicting an embodiment of a system having an augmented power supply circuit and a half bridge circuit.

FIG. 1 depicts an embodiment of a system 20 for driving a load 36. The system 20 can include an augmented power supply circuit 24, a channel drive circuit 28, a half bridge circuit 32, and the load 36. The augmented power supply circuit 24 may supply a supply voltage VAPS to a gate driver circuit 40-1 of the channel drive circuit 28. The channel drive circuit 28 may deliver gate drive signals to the half bridge circuit 32. The half bridge circuit 32 may drive the load 36.

The augmented power supply circuit 24 can include an isolated power supply circuit 44 and a cyclic charging power supply circuit 48. The isolated power supply circuit 44 may receive a first voltage V1 in an isolated system on a first side of one or more isolation barriers 60 and supply power to the cyclic charging power supply circuit 48 in an isolated system on a second side of the one or more isolation barriers 60. The isolated power supply circuit 44 can include a power control circuit 52 to control the power delivered by the isolated power supply circuit 44 to the cyclic charging power supply circuit 48. The cyclic charging power supply circuit 48 may receive a second voltage V2 in the isolated system on the second side of the one or more isolation barriers 60 and provide the supply voltage VAPS to the gate driver circuit 40-1. The cyclic charging power supply circuit 48 may provide the supply voltage VAPS as a function of a cyclic charging of a capacitive energy storage element such as a capacitor. The second voltage V2 can include one or more of a generated supply voltage or a voltage from a node of the system 20.

The channel drive circuit 28 can include first and second isolated signal channel circuits 68-1, 68-2 and first and second gate driver circuits 40-1, 40-2. The isolated signal channel circuits 68-1, 68-2 may receive respective input data signals from one or more data sources 72-1, 72-2 in an isolated system on a first side of one more isolation barriers 76 and provide respective output data signals to the corresponding gate driver circuits 40-1, 40-2 in an isolated system on a second side of the one or more isolation barriers 76.

The gate driver circuits 40-1, 40-2 may provide respective gate drive signals to corresponding transistors N1, N2 of the half bridge circuit 32 in response to the output data signals received from the isolated signal channel circuits 68-1, 68-2. The first gate driver circuit 40-1 may drive a gate of a first NMOS transistor N1 of the half bridge circuit 32 to voltages ranging between the supply voltage VAPS received from the augmented power supply circuit 60 and a voltage VL at the load 36. The second gate driver circuit 40-2 may drive a gate of a second NMOS transistor N2 of the half bridge circuit 32 to voltages ranging between the second voltage V2 and a ground in the isolated system on the second side of the one or more isolation barriers 60, 76.

The half bridge circuit 32 can include the first and second NMOS transistors N1, N2 to drive the load 36. The first NMOS transistor N1 can include a gate connected to and receiving the gate drive signal from the first gate driver circuit 40-1, a source connected to the load 36, and a drain connected to a power bus VBUS on the second side of the one or more isolation barriers 60, 76. The second NMOS transistor N2 can include a gate connected to and receiving the gate drive signal from the second gate driver circuit 40-2, a source connected to a ground on the second side of the one or more isolation barriers 60, 76, and a drain connected to the load 36.

Figure 2:
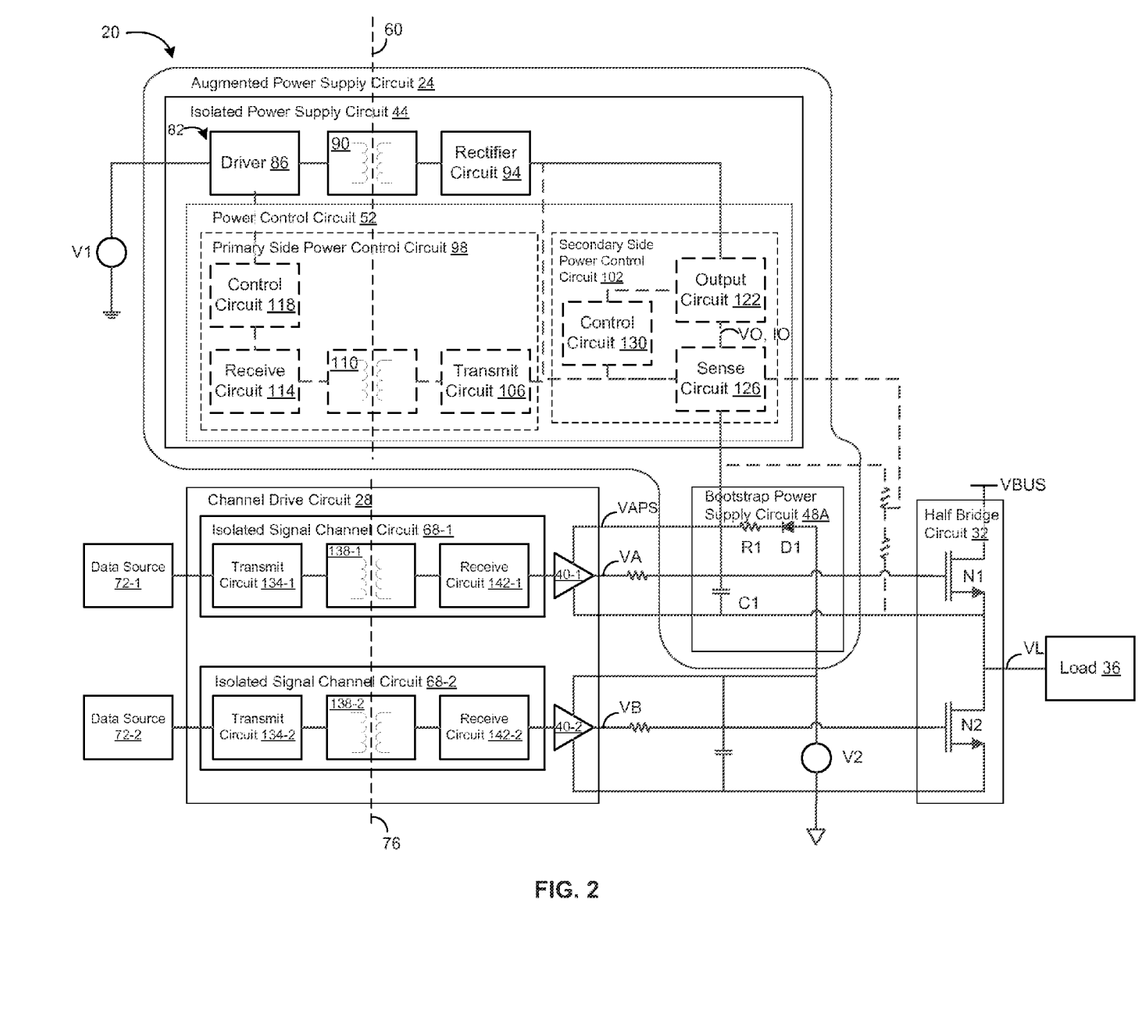
FIG. 2 is a schematic diagram depicting another embodiment of the system having the augmented power supply circuit and the half bridge circuit.

FIG. 2 depicts another embodiment of the system 20 for driving the load 36, showing further details regarding embodiments of the augmented power supply circuit 24 and channel and driver circuits 28.

In FIG. 2, the cyclic charging power supply circuit 48 can include a bootstrap power supply circuit 48A. The bootstrap power supply circuit 48A of the augmented power supply circuit 24 may control a voltage at or a current supplied to the supply voltage node to provide a functionally isolated and/or electrically floating supply voltage VAPS to the first gate driver circuit 40-1 to enable the first gate driver circuit 40-1 to drive the first NMOS transistor N1 of the half bridge circuit 32. The bootstrap power supply circuit 48A can include a bootstrap capacitor C1, connected between terminals of the bootstrap power supply circuit 48A, and a diode D1 and a resistor R1 connected in series between the second voltage V2 of the isolated system and the bootstrap capacitor C1. The terminals of the bootstrap power supply circuit 48A may be connected to an upper and lower supply terminals of the first gate driver circuit 40-1, with the lower terminal of the first gate driver circuit 40-1 and the bootstrap capacitor C1 also connected to the source of the first NMOS transistor N1 of the half bridge circuit 32.

In operation, when the second gate driver circuit 40-2 drives the second NMOS transistor N2 of the half bridge circuit 32 into an electrically conducting on state, the first gate driver circuit 40-1 may drive the first NMOS transistor N1 of the half bridge circuit 32 in an electrically non-conducting off state, the voltage VL at the load 36 and the lower terminal of the bootstrap capacitor C1 may be driven toward the ground of the isolated system, and a current may flow through the diode D1 and resistor R1 of the bootstrap power supply circuit 48 from the second voltage V2 of the isolated system to the upper terminal of the bootstrap capacitor C1 to charge the bootstrap capacitor C1 to a voltage approaching that of the second voltage V2 minus a diode voltage drop.

Subsequently, when the second gate driver circuit 40-2 drives the second NMOS transistor N2 into an off state, the first gate driver circuit 40-1 may drive the first NMOS transistor N1 into an on state, the voltage VL at the load 36 may no longer be driven toward ground, a current may no longer flow through the diode D1 and resistor R1 of the bootstrap power supply circuit 48, and the bootstrap capacitor C1 may instead provide the supply voltage VAPS that is functionally isolated and/or electrically floating relative to the voltage supply and ground (instead referenced from the voltage VL at the load 36, the source of first NMOS transistor N1, and the lower terminal of the first gate drive circuit 40-1).

The bootstrap power supply circuit 48A may thus provide a functionally isolated and/or electrically floating supply voltage VAPS to the first gate driver circuit 40-1 to enable the first gate driver circuit 40-1 to drive the first NMOS transistor N1 in an on state.

However, when considered by itself, outside of augmented operation in conjunction with the isolated power supply circuit 44, operation of a bootstrap power supply circuit may entail some limitations. For example, a supply voltage provided by a bootstrap power supply operating alone to power a gate driver circuit may decrease over time as the gate driver circuit draws power from a bootstrap capacitor to drive a half bridge circuit. This may in turn limit the duty cycle variation of the half bridge circuit, as the gate driver circuit may no longer be able to drive the half bridge circuit when the bootstrap capacitor voltage falls below a certain threshold. In another example, a bootstrap power supply operating alone may also require an undesirable lengthy startup sequence before the bootstrap power supply is able to supply a suitable supply voltage to a high side gate driver circuit, the sequence including a low side gate driver circuit and corresponding data channel circuits being activated and operated to turn on a low side transistor of the half bridge circuit before charging of the bootstrap capacitor can begin.

The isolated power supply circuit 44 may augment operation of the bootstrap power supply circuit 48A within the augmented power supply circuit 24 to provide the supply voltage VAPS to the first gate drive circuit 40-1 in an improved manner to enable both an arbitrary duty cycle of the half bridge circuit 32 and an accelerated startup time of the system 20, among other advantages.

The isolated power supply circuit 44 can include a power delivery circuit 82 and the power control circuit 52. The power delivery circuit 82 may deliver power to the bootstrap power supply circuit 48A, including to the bootstrap capacitor C1, from the first voltage V1 on the first side of the one or more first isolation barriers 60, across the one or more isolation barriers 60, and optionally via one or more components of the power control circuit 52. The power control circuit 52 may control the power delivered to the bootstrap power supply circuit 48A by the isolated power supply circuit 44.

The power delivery circuit 82 can include a driver circuit 86, an isolator device 90, and a rectifier circuit 94. The driver circuit 86 may drive the isolator device 90 as a function of an oscillation signal. The driver circuit 86 can include an oscillator to provide the oscillation signal. The isolator device 90 may provide communication across the one or more isolation barriers 60. In one embodiment, the isolator device 90 can include an inductive isolator device such as one or more of a transformer or a coupled pair of inductors (which may be overlapping categories of devices). The one or more isolation barriers 60 may provide galvanic isolation between the systems on either side of the isolation barriers 60, and can include a layer of material such as polyimide. The rectifier circuit 94 may rectify a signal received from the isolator device 90 to provide a rectified voltage. The rectifier circuit 94 can include one or more diodes to perform the rectification. The power delivery circuit 82 can also optionally include a filter circuit (not shown) that may filter the rectified signal. The filter can include a capacitor. The filter can alternatively be omitted or incorporated into an output circuit 122 of the power control circuit 52.

The power control circuit 52 can include one or more of a primary side power control circuit 98 or a secondary side power control circuit 102. The primary side power control circuit 98 may control the power delivered by the isolated power supply circuit 44 to the bootstrap power supply circuit 48A by controlling operation of the driver circuit 86 on the first side of the one or more isolation barriers 60. The secondary side power control circuit 102 may control the power delivered by the isolated power supply circuit 44 to the bootstrap power supply circuit 48A by controlling operation of an output circuit 122 of the secondary side power control circuit 102 on the second side of the one or more isolation barriers 60.

The primary side power control circuit 98 can include a transmit circuit 106, an isolator device 110, a receive circuit 114 and a control circuit 118. The transmit circuit 106 may receive the rectified signal from the rectifier circuit 94 and drive a signal based on the rectified signal onto the isolator device 110. Optionally, the transmit circuit may receive a sense signal from a sense circuit 126 (discussed below) of the secondary side power control circuit 102 and drive a signal based on the sense signal onto the isolator device 110 in addition to or instead of the rectified signal. The transmit circuit 106 can include one or more components to encode and/or modulate the rectified signal to produce the drive signal. The isolator device 110 may provide communication across the one or more isolation barriers 60. The isolator device 110 can include an inductive isolator device such as one or more of a transformer or a coupled pair of inductors. The receive circuit 114 may receive a signal from the isolator device 110 and provide a signal based on the received signal to the control circuit 118. The receive circuit 114 can include one or more components to decode and/or demodulate the received signal to produce the signal provided to the control circuit 118. The control circuit 118 may control operation of the driver circuit 86 in response to the signal provided by the receive circuit 114 to control the power delivered by the power delivery circuit 82 to the bootstrap power supply circuit 48A, as discussed further below. The control circuit 118 can take a variety of forms, such as including circuitry configured to control operation of the driver circuit 86.

The secondary side power control circuit 102 can include an output circuit 122, a sense circuit 126, and a control circuit 130. The output circuit 122 may provide an output signal for delivery to the bootstrap power supply circuit 48A based on the rectified signal and any control signal received from the control circuit 130. The output circuit 122 can include one or more of a conductor, a resistor, a transistor, or other circuit components, according to embodiments discussed herein. The sense circuit 126 may sense one or more of a voltage level or a current level of the output signal provided by the output circuit 122 and provide a signal representative of the sensed output signal to the control circuit 130. The sense circuit 126 can include one or more of a conductor, a voltage sensor, or a current sensor, according to embodiments discussed herein. The control circuit 130 may control operation of the output circuit 122 in response to the signal provided by the sense circuit 126 to control the power delivered by the output circuit 122 to the bootstrap power supply circuit 48A. The control circuit 130 can take a variety of forms, such as including circuitry configured to control operation of the output circuit 122 as a function of the sensed signal.

Embodiments of the power control circuit 52 can optionally include only the primary side power control circuit 98, only the secondary side power control circuit 102, or both the primary and secondary side power control circuits 98, 102. The functionality of the power control circuit 52 to control the power delivered by the isolated power supply circuit 44 to the bootstrap power supply circuit 48 can correspondingly be performed entirely by the primary side power control circuit 98, entirely by the secondary side power control circuit 102, or selectively distributed between the primary and secondary side power control circuits 98, 102.

The isolated power supply circuit 44 may augment operation of the bootstrap power supply circuit 48A to enable provision of the supply voltage VAPS to the first gate drive circuit 40-1 in an improved manner by selectively supplying power to the bootstrap power supply circuit 48A to augment the power developed and supplied by the bootstrap power supply circuit 48A.

The isolated power supply circuit 44 may augment operation of the bootstrap power supply circuit 48A by supplying power to the bootstrap power supply circuit 48A during and in response to a phase of the first gate driver circuit 40-1 to drive the first NMOS transistor N1 of the half bridge circuit 32 in an on state. The isolated power supply circuit 44 also may not supply power to the bootstrap power supply circuit 48A during and in response to a phase of the first gate driver circuit 40-1 to drive the first NMOS transistor N1 of the half bridge circuit 32 in an off state. The isolated power supply circuit 44 may supply power to the bootstrap power supply circuit 48A during the phase of the first gate driver circuit 40-1 to drive the first NMOS transistor N1 of the half bridge circuit 32 in the on state as a function of the supply voltage VAPS during this phase and as discussed below.

Figures 3A, 3H:
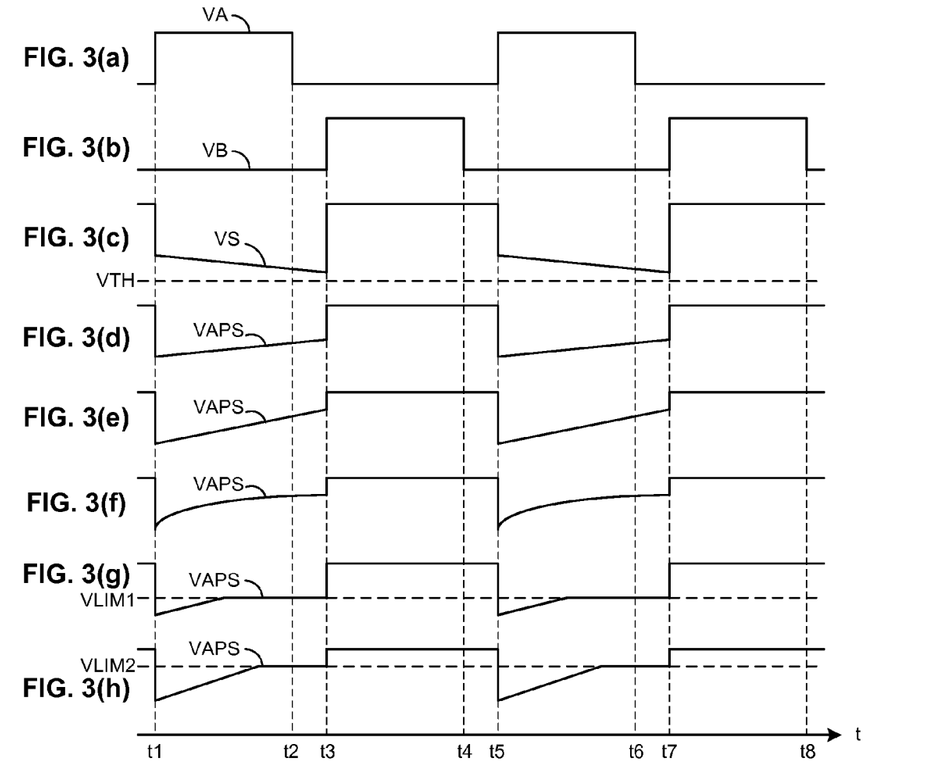
FIG. 3(a) is a signal diagram depicting an embodiment of an output signal of a gate driver circuit.
FIG. 3(h) is a signal diagram depicting another embodiment of the supply voltage of the augmented power supply circuit.

FIG. 3 is a diagram depicting embodiments of signals of the augmented power supply circuit 24 and gate driver circuits 40-1, 40-2. Note that FIG. 3, as well as FIGS. 4 and 6, discussed below, may not show voltage level relationships of and/or between various depicted signals to scale, and instead may exaggerate certain voltage level relationships for purposes of illustration.

FIG. 3($a$) depicts an embodiment of a logical representation of an output voltage VA of the first gate driver circuit 40-1 and FIG. 3($b$) depicts an embodiment of a logical representation of an output voltage VB of the second gate driver circuit 40-2.

At time t1, the first gate driver circuit 40-1 outputs a voltage representing a logical high signal, turning the first NMOS transistor N1 of the half bridge circuit 32 on, and the second gate driver circuit 40-2 outputs a voltage representing a logical low signal, keeping the second NMOS transistor N2 of the half bridge circuit 32 off. At time t2, the first gate driver circuit 40-1 outputs a voltage representing a logical low signal, turning the first NMOS transistor N1 off. Thus, between times t1 and t2, the first NMOS transistor N1 drives the load 36 and the second NMOS transistor N2 is deactivated. At time t3, the second gate driver circuit 40-2 outputs a voltage representing a logical high signal, turning the second NMOS transistor N2 on, and the first gate driver circuit 40-1 continues to output a voltage representing a logical low signal, keeping the first NMOS transistor N1 off. At time t4, the second gate driver circuit 40-2 outputs a voltage representing a logical low signal, turning the second NMOS transistor N2 off. Thus, between times t3 and t4, the second NMOS transistor N2 drives the load 36 and the first NMOS transistor N1 is deactivated. This cycle can repeat periodically, for example as at times t5, t6, t7 and t8.

Figures 4A, 4D:
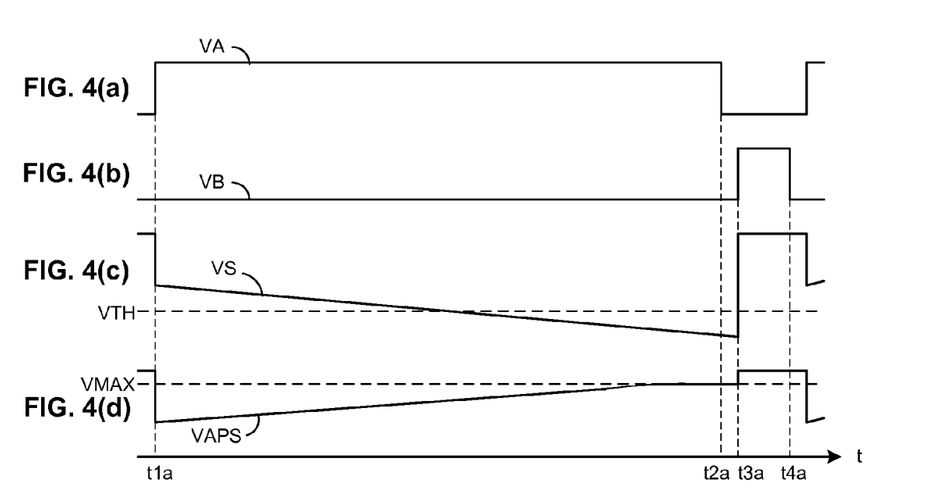
FIG. 4(a) is a signal diagram depicting another embodiment of an output signal of a gate driver circuit.
FIG. 4(d) is a signal diagram depicting another embodiment of the supply voltage of the augmented power supply circuit.

The duty cycles and/or on times of the outputs of the first and second gate driver circuits 40-1, 40-2 and the half bridge circuit 32 can vary during operation of the half bridge circuit 32 to drive the load 36. In the embodiment of FIGS. 3($a$) and 3($b$), the duty cycles of the outputs of the first and second gate driver circuits 40-1, 40-2 are relatively equal. FIG. 4 is a diagram depicting additional embodiments of signals of the augmented power supply circuit 24 and the gate driver circuits 40-1, 40-2. FIGS. 4($a$) and 4($b$) depict embodiments of logical representations of output voltages of the first and second gate driver circuits 40-1, 40-2, respectively, in which the duty cycles of the outputs of the first and second gate driver circuits 40-1, 40-2 are fairly unequal, with the output of the first gate driver circuit 40-1 having a much higher duty cycle than the output of the second gate driver circuit 40-2.

Operation of a bootstrap power supply circuit without augmentation by the isolated power supply 44 may entail limitations on the variability of the duty cycle of a gate driver circuit and a half bridge circuit. Returning to FIG. 3, FIG. 3($c$) depicts an embodiment of a supply voltage VS provided by a bootstrap power supply circuit without augmentation by the isolated power supply circuit. Prior to time t1, the bootstrap power supply circuit has generated a supply voltage VS. At time t1, a gate driver circuit begins to draw power from a bootstrap capacitor of the bootstrap power supply circuit to drive a half bridge circuit, and the supply voltage VS supplied by the bootstrap power supply circuit accordingly suffers an immediate sharp decrease followed by a more gradual further decrease over time. Decrease of the supply voltage VS below a threshold voltage VTH will undesirably degrade operation of the gate driver circuit to drive the half bridge prevent, such as by depriving the gate driver circuit of a sufficiently high electrically floating supply voltage to suitably turn on a corresponding transistor of the half bridge circuit. In FIG. 3($c$), the supply voltage VS does not decrease below the threshold voltage VTH due to the relatively lower duty cycle depicted. However, returning to FIG. 4, FIG. 4($c$) depicts another embodiment of a supply voltage VS provided by a bootstrap power supply circuit without augmentation by the isolated power supply circuit, in which the supply voltage VS does decrease below the threshold voltage VTH due to the relatively higher duty cycle depicted, thereby adversely affecting operation of the gate driver circuit and half bridge circuit.

The isolated power supply circuit 44 may operate to selectively provide power to the bootstrap power supply circuit 48A to maintain or increase the supply voltage VAPS provided to the first gate driver circuit 40-1 and enable an arbitrary duty cycle variation and/or on time of the first gate driver circuit 40-1 and half bridge circuit 32. To selectively provide power by the isolated power supply circuit 44 to the bootstrap power supply circuit 48A, the power control circuit 52 may operate in various different power control modes, including one or more of a current regulation mode, a voltage regulation mode, a power regulation mode, a temperature regulation mode, an impedance regulation mode, or a startup/reset mode.

In the current regulation mode, the power control circuit 52 may operate to control the power provided by the isolated power supply circuit 44 as a function of an output current IO supplied by the isolated power supply circuit 44 to the bootstrap power supply circuit 48A. The current regulation mode can include operation by the power control circuit 52 to control the supply of power to power levels corresponding to an output current IO at or below a selected predetermined current level.

Returning to FIG. 3, FIGS. 3($d$), 3($e$) and 3($f$) depict embodiments of the supply voltage VAPS provided by operation of the bootstrap power supply circuit 48A augmented by the isolated power supply circuit 44 operating in the current regulation mode. In FIG. 3($d$), in response to the first gate driver circuit 40-1 driving the first NMOS transistor of the half bridge circuit 32 in the on state, the isolated power supply 44 begins to deliver power to the bootstrap power supply circuit 48A at an output current limited to a selected current level. As a result, the isolated power supply circuit 44 prevents the supply voltage VAPS from decreasing as the first gate driver circuit 40-1 draws power, and even supplies enough power to gradually increase the supply voltage VAPS while the first gate driver circuit 40-1 is driving the first NMOS transistor N1 in the on state. FIGS. 3(e) and 3(f) show similar scenarios, with the power being supplied in the same fashion but at a higher predetermined current limit in FIG. 3(e), and the power being supplied in a current-limited manner showing a time constant characteristic in FIG. 3(f), such as may result from specific forms of the output circuit 122.

In the voltage regulation mode, the power control circuit 52 may operate to control the power provided by the isolated power supply circuit 44 as a function of the output voltage VO supplied by the isolated power supply circuit 44 to the bootstrap power supply circuit 48A. The voltage regulation mode can include operation by the power control circuit 52 to control the supply of power to power levels corresponding to an output voltage VO at a selected predetermined voltage level.

FIGS. 3(g) and 3(h) depict embodiments of the supply voltage VAPS provided by operation of the bootstrap power supply circuit 48 augmented by the isolated power supply circuit 44 operating in the voltage regulation mode. In FIG. 3(g), in response to the first gate driver circuit 40-1 driving the first NMOS transistor N1 of the half bridge circuit 32 in the on state, the isolated power supply circuit 44 delivers power to the bootstrap power supply circuit 48A at a level to increase the supply voltage VAPS until the supply voltage VAPS reaches a selected predetermined voltage limit VLIM1, at which point the isolated power supply circuit 44 delivers power to the bootstrap power supply circuit 48A at a level to only maintain the supply voltage VAPS at the predetermined voltage limit. FIG. 3(h) shows a similar scenario, but involving a relatively higher selected predetermined voltage limit VLIM2.

The predetermined voltage level at which the power control circuit 52 can control the isolated power supply circuit 44 to provide power may be selected to have a predetermined relationship to the peak level of the supply voltage VAPS provided by the bootstrap power supply circuit 48A at the beginning of phase during which the gate driver circuit 40-1 drives the transistor N1 in the on state. In one embodiment, the predetermined voltage level can be selected to be lower than the peak level of the supply voltage VAPS provided by the bootstrap power supply 48A, which may enable the bootstrap power supply circuit 48A to act as a primary source of supply power for the gate driver circuit 40-1 and the isolated power supply circuit to act as a supplemental source of supply power for the gate driver circuit 40-1. Such a division of primary and supplemental supply power delivery may advantageously utilize strengths and offset weaknesses in operation of the augmented power supply circuit 24 in some instances, such as by avoiding overheating of the isolated power supply circuit 44 that may accompany excessive power delivery by the isolated power supply circuit 44.

In one embodiment, the power control circuit 52 may implement a negative feedback setpoint control scheme having the selected predetermined voltage level as a setpoint.

In the power regulation mode, the power control circuit 52 may operate to control the power provided by the isolated power supply circuit 44 as a function of the output power supplied by the isolated power supply circuit 44 to the bootstrap power supply circuit 48A. The current regulation mode can include operation by the power control circuit 52 to control the supply of power at power levels at or below a selected predetermined level of the output power.

Figure 5:
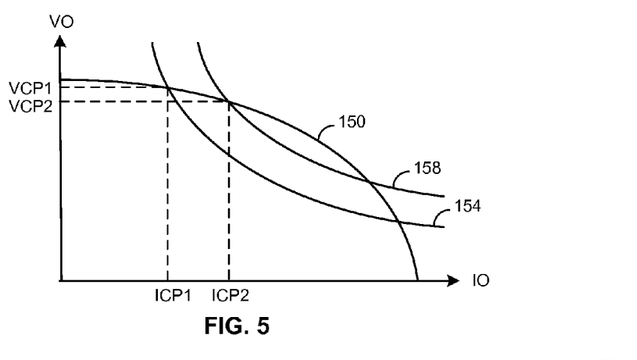
FIG. 5 is a graph depicting embodiments of power characteristics of the augmented power supply circuit.

FIG. 5 is a graph depicting embodiments of power characteristics of the isolated power supply circuit 44. In FIG. 5, the x- and y-axes represent the output current IO and the output voltage VO, respectively, of the isolated power supply 44. A first plot shows an embodiment of the power transfer characteristic 150 of the isolated power supply 44 without any regulation. A second plots shows an embodiment of a first constant power characteristic 154 representing combinations of output voltages and output currents resulting in a first constant power level. A third plots shows an embodiments of a second constant power characteristic 158 representing combinations of output voltages and output currents resulting in a second constant power level greater than the first constant power level.

To control supply of power by the power delivery circuit 52 to power levels at or below a selected predetermined power level, the power control circuit 52 can limit the output voltage VO and the output current IO to levels underneath a constant power characteristic corresponding to the selected predetermined power level. For example, to supply power at power levels at or below the first constant power level depicted in FIG. 5, the power control circuit 52 can limit the output voltage VO to levels below a first constant-power voltage level VCP1 and the output current IO to levels below a first constant-power current level ICP1. Similarly, to supply power at power levels at or below the second constant power level depicted in FIG. 5, the power control circuit can limit the output voltage VO to levels below a second constant power-voltage level VCP2 and the output current IO to levels below a second constant-power current level ICP2.

The power control circuit 52 may select the predetermined power level for purpose of limiting the power supplied by the isolated power supply 44 as a function of various factors. For example, the power control circuit 52 may select the predetermined power level for purpose of limiting the power supplied by the isolated power supply 44 as a function of an actual or estimated operating temperature of the isolated power supply 44. In such a scenario, the power control circuit 52 may select one or more relatively higher predetermined power level limits for relatively lower temperatures of the isolated power supply 44, and one or more relatively lower predetermined power level limits for relatively higher temperatures of the isolated power supply 44.

In the temperature regulation mode, the power control circuit 52 may operate to control the power provided by the isolated power supply circuit 44 as a function of an actual or estimated operating temperature of the isolated power supply circuit 44. The temperature regulation mode can include operation by the power control circuit 52 to control the supply of power to power levels corresponding to operating temperatures of the isolated power supply circuit 44 at or below a selected predetermined temperatures.

The augmented power supply circuit 24 or another component of the system 20 can optionally include a temperature sensor or temperature estimation circuit for use in measuring or estimated the temperature of the isolated power supply circuit 44 as discussed above.

In the impedance regulation mode, the power control circuit 52 may operate to control the power provided by the isolated power supply circuit 44 as a function of an impedance of the isolated power supply circuit 44. The impedance regulation mode can include operation by the power control circuit 52 to control the supply of power by the use and/or selection of an impedance in the output circuit 122 in the path of connection of the power delivery circuit 82 to the bootstrap power supply circuit 48A. For example, the impedance regulation mode may include use, selection or control by the power control circuit of an impedance in the output circuit 122 having a relatively higher impedance level, such as a relatively higher resistance, to supply power at a relatively lower power lower; and use, selection or control by the power control circuit 52 of an impedance in the output circuit 122 having a relatively lower impedance level, such as a relatively lower resistance, to supply power at a relatively higher power lower.

Embodiments of the power, temperature and impedance regulation modes may produce supply voltages VAPS having characteristics resembling those depicted in FIGS. 3(*d*)-3(*h*) in some respects.

The isolated power supply circuit 44 may operate to limit the power supplied to the bootstrap power supply circuit 48A for relatively large duty cycles and/or on times of the first gate driver circuit 40-1 and the half bridge circuit 32. Limiting the power supplied in such circumstances can further enable arbitrary duty cycles of the gate driver circuits 40-1, 40-2 and half bridge circuit 32 by preventing the development of too large of supply voltage. Returning to FIG. 4, FIG. 4(*d*) depicts an embodiment of the supply voltage VAPS supplied by the augmented power supply circuit 24 for a relatively large duty cycle and/or on time of the first gate driver circuit 40-1 and first NMOS transistor N1. In FIG. 4(*d*), upon the first gate driver circuit 40-1 driving the first NMOS transistor N1 into the on state, the supply voltage VAPS initially increases but after a time period reaches a maximum level VMAX and no longer increases. The isolated power supply circuit 44 can implement the maximum supply voltage level VMAX as either a configured natural limit of the isolated power supply circuit 44 to augment the bootstrap power supply circuit 48A to boost the supply voltage VAPS, or by using one of the operating modes of the power control circuit 52 as discussed above, such as the voltage regulation mode.

The augmented power supply circuit 24 may also operate to enable an improved startup sequence of the system 20 by providing an initial charging of the bootstrap capacitor C1 of the bootstrap power supply circuit 48A by the isolated power supply circuit 44 upon startup, reset or in other operational scenarios of the system 20.

Figures 6A, 6B, 6C:
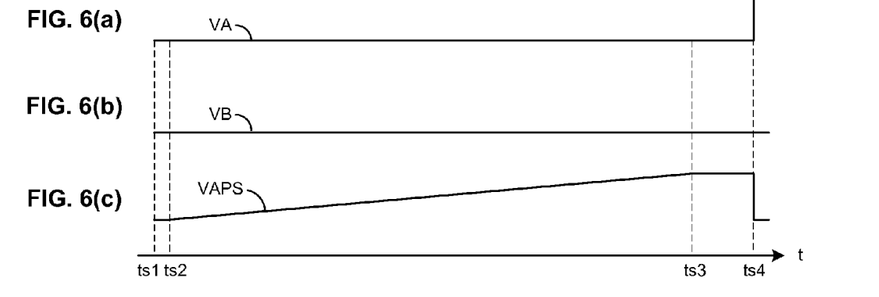
FIG. 6(a) is a signal diagram depicting another embodiment of an output signal of a gate driver circuit.
FIG. 6(b) is a signal diagram depicting another embodiment of an output signal of a gate driver circuit.
FIG. 6(c) is a signal diagram depicting another embodiment of the supply voltage of the augmented power supply circuit.

FIG. 6 is a signal diagram depicting embodiments of signals of the gate driver circuits 40-1, 40-2 and the augmented power supply circuit 24. FIG. 6(*a*) depicts an embodiment of a logical representation of an output voltage VA of the first gate driver circuit 40-1, FIG. 6(*b*) depicts an embodiment of a logical representation of an output voltage VB of the second gate driver circuit 40-2, and FIG. 6(*c*) depicts an embodiment of the supply voltage VAPS provided by the augmented power supply circuit 24.

At time ts1, the system 20 is activated from a deactivated state, at which time the outputs VA, VB of both of the first and second gate driver circuits 40-1, 40-2 remain in a logic low state, the first and second NMOS transistors N1, N2 of the half bridge circuit 32 remain off, and the bootstrap capacitor C1 is in a substantially uncharged state. At time ts2, a relatively short time after time ts1, the isolated power supply circuit 44 becomes fully active and begins to supply power to the bootstrap power supply circuit 48A and charge the bootstrap capacitor C1, and thus the supply voltage VAPS begins to increase, while the outputs VA, VB of both of the first and second gate driver circuits 40-1, 40-2 remaining in a logic low state and the first and second NMOS transistors N1, N2 remain off. At time ts3, the bootstrap capacitor C1 reaches a fully charged level and the supply voltage VAPS reaches a fully activated value, again with the outputs VA, VB of both of the first and second gate driver circuits 40-1, 40-2 remaining in a logic low state and the first and second NMOS transistors N1, N2 remaining off. At time ts4, the output VA of the first gate driver circuit 40-1 may transition to a logic high value, activating the first NMOS transistor N1 for the first time after the startup or reset.

By contrast, as discussed above, a bootstrap power supply operating alone may require an undesirable lengthy startup sequence before the bootstrap power supply is able to supply a suitable supply voltage to a high side gate driver circuit, as a low side gate driver circuit and corresponding data channel circuits must be activated and operated to turn on a low side transistor of the half bridge circuit before charging of the bootstrap capacitor can begin.

The power control circuit 52 of the isolated power supply 44 can be configured in a variety of different ways to provide one or more of the functions of the isolated power supply 44 discussed above. For example, the power control circuit 52 can be hardwired to provide one or more of these functions. Alternatively, the power control circuit 52 can be programmable to provide one or more of these functions.

Figure 7:
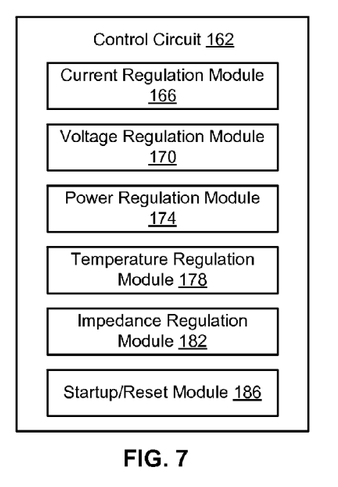
FIG. 7 is a schematic diagram depicting an embodiment of a control circuit that can be used to implement one or more control circuits of the augmented power supply circuit.

FIG. 7 depicts an embodiment of a control circuit 162 that can be used to implement one or both of the control circuits 118, 130 of the primary and secondary power control circuits 98, 102. In FIG. 7, the control circuit 162 can include one or more of a current regulation module 166 to implement the current regulation mode, a voltage regulation module 170 to implement the voltage regulation mode, a power regulation module 174 to implement the power regulation mode, a temperature regulation module 178 to implement the temperature regulation mode, an impedance regulation module 182 to implement the impedance regulation mode, or a startup/reset module 186 to implement startup functions.

The power control circuit 52 can also be configured to take a minimal form necessary to only provide certain selected ones of the functions discussed above. For example, in one embodiment, the isolated power supply circuit 44 may be essentially unregulated, such as by omitting feedback regulation, and the power control circuit 52 can include circuitry configured to operate the forward power delivery circuit in an selected essentially unregulated state, such as an embodiment of the control circuit 118 of the primary side power control circuit 98 or an equivalent circuit, and omit other components.

The augmented power supply circuit 24 can trigger the isolated power supply circuit 44 to supply power to the bootstrap power supply circuit 48A in different ways. For example, the isolated power supply circuit 44 can begin and/or stop supplying power to the bootstrap power supply circuit 48A in response to a trigger event such as one or more of a startup of the isolated system 20, a change in the logic level output of the first gate drive circuit 40-1, or a value of the supply voltage VAPS passing a predetermined level.

Figure 8:
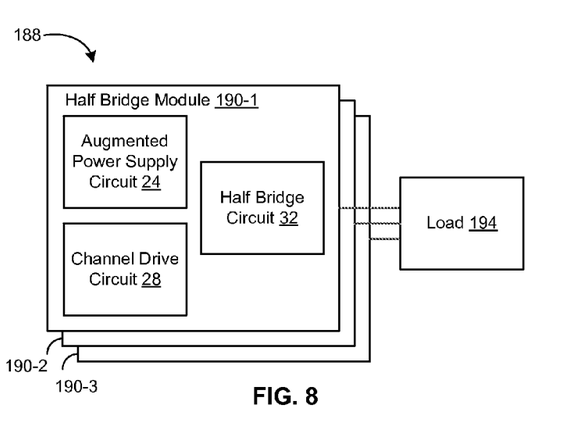
FIG. 8 is a schematic diagram depicting an embodiment of a polyphase system having a plurality of half bridge modules including the augmented power supply.

The augmented power supply circuit may be used in both single and polyphase systems. For example, embodiments of the system 20 depicted in FIG. 1 or 2 may be used as a single phase system. FIG. 8 depicts an embodiment of a system 188 that may be used as a polyphase system. The system 188 can include a plurality of half bridge modules 190-1, 190-2, 190-3, each of the half bridge modules 190-1, 190-2, 190-3 including embodiments of the augmented power supply 24, channel drive circuit 28, and half bridge circuit 32 as in FIG.

1 or 2. Each of the half bridge modules 190-1, 190-2, 190-3 can be connected to a load 194 to provide a single phase of a polyphase system. Although FIG. 8 depicts an embodiment of the system 188 having three half bridge modules 190-1, 190-2, 190-3, and thus may be suitable for use a three phase system, other embodiments of the system 188 can include any number of half bridge modules 190-1, 190-2, 190-3 . . . to provide a polyphase system with an arbitrary number of phases.

Returning to FIG. 2, the isolated signal channel circuits 68-1, 68-2 can each include a transmit circuit 134-1, 134-2, an isolator device 138-1, 138-2, and a receive circuit 142-1, 142-2. The transmit circuit 134-1, 134-2 may receive the input data signal from the data source 72-1, 72-2 and drive a signal based on the input data signal onto the isolator device 138-1, 138-2. The transmit circuit 134-1, 134-2 can include one or more components to encode and/or modulate the input data signal to produce the drive signal. The isolator device 138-1, 138-2 may provide communication across the one or more isolation barriers 76 and can include an inductive isolator device such as one or more of a transformer or a coupled pair of inductors. The one or more isolation barriers 76 may provide galvanic isolation between the systems on either side of the isolation barriers 76 and can include a layer of material such as polyimide. The receive circuit 142-1, 142-2 may receive a signal from the isolator device 138-1, 138-2 and provide a signal based on the received signal to respective gate drive circuit 40-1, 40-2. The receive circuit 142-1, 142-2 can include one or more components to decode and/or demodulate the received signal to produce the signal provided to the gate drive circuit 40-1, 40-2.

Returning to FIG. 1, the ground connections depicted may exist on various sides of the one or more isolation barriers 60, 76. For example, the ground connection to the first voltage V1 may exist on the first side (to the left as depicted) of one or more of the one or more isolation barriers 60, 76. The ground connection to the second voltage V2 may exist on either the first side or a second side (to the right as depicted) of one or more of the one or more isolation barriers 60, 76. The ground connection to the transistor N2 may exist on either the first side or the second side of one or more of the one or more isolation barriers 60, 76.

The number of isolated systems and isolation barriers may vary. The allocation of circuits and/or systems discussed herein to semiconductor dies may also vary.

The augmented power supply circuit 24 may also be used with single-switch load driving circuits and other embodiments of multiple-switch load driving circuits. FIG. 9 depicts an embodiment of a system 200 including the augmented power supply circuit 24 and a single-switch load driving circuit. The single switch load driving circuit can include a single low-side NMOS transistor N3 to drive a load 204. The single NMOS transistor N3 can include a gate connected to and receiving a gate drive signal from a gate driver circuit 40-3, a drain connected to the load 204, and a source connected to ground. A bootstrap power supply circuit 48B of the augmented power supply circuit 24 can include a bootstrap capacitor C2, a diode D3, a capacitor C3, a resistor R2, a diode D3, and a shunt regulator 208.

In operation, the bootstrap power supply circuit 48B may charge the bootstrap capacitor C2 while the transistor N3 is driven in an on state by the gate driver 40-3 through a path from the load voltage VLA including the resistor R2, capacitor C3 and diode D2, so that the bootstrap power supply circuit 48B may provide a functionally isolated and/or electrically floating supply voltage VAPSA to the gate driver circuit 40-3 when the gate driver circuit 40-3 is driving the NMOS transistor N3 in the on state as a function of the load voltage VLA, which may be referred to as a self bootstrap operation. The isolated power supply circuit 44 of the augmented power supply circuit 24 may provide power to the bootstrap power supply circuit 48B while the gate driver circuit 40-3 is driving the NMOS transistor N3 in the on state and to initially charge the capacitor C2 upon startup or reset of the augmented power supply circuit 24 as variously discussed herein.

The augmented power supply circuit 24 may also be used with other embodiments of single switch load driving circuits. Such single switch load driving circuits can include one or more of a single low-side NMOS transistor connected to and driving a load (such as, e.g., the single low-side NMOS transistor configuration depicted in FIG. 9, discussed above), a single high-side NMOS transistor connected to and driving a load (such as, e.g., the single high-side NMOS transistor configuration depicted in FIG. 10, discussed below), or a single floating NMOS transistor to provide bi-directional driving of first and second loads (such as, e.g., a single floating NMOS transistor including a gate connected to and receiving a gate drive signal from a gate driver circuit, a drain connected to the first load, and a source connected to the second load).

The cyclic charging power supply circuit 48 of the augmented power supply circuit 24 may include one or more of a bootstrap power supply circuit, a charge pump power supply circuit, or other cyclic charging power supply circuits. FIG. 10 depicts another embodiment of a system 212 including the augmented power supply circuit 24 and a single-switch load driving circuit. The cyclic charging power supply circuit 48 can include a combined bootstrap and charge pump power supply circuit 48C. The combined bootstrap and charge pump power supply circuit 48C can include a bootstrap capacitor C4, a diode D4, a charge pump capacitor C5, a diode D5, a diode D6, a capacitor C6, a resistor R3 and a shunt regulator 220. The single switch load driving circuit can include a single high-side NMOS transistor N4 to drive a load 216. The single NMOS transistor N4 can include a gate connected to and receiving a gate drive signal from a gate driver circuit 40-4, a drain connected to the power bus VBUS, and a source connected to the load 216.

In operation, the combined bootstrap and charge pump power supply circuit 48C may charge the charge pump capacitor C5 while the transistor N4 is driven in an on state by the gate driver circuit 40-4 through a path from the load voltage VLB including the resistor R3, capacitor C6 and diode D5. The bootstrap capacitor C4 may be charged while the transistor N4 is driven in an off state by the gate driver circuit 40-4, through a path from the capacitor C5 through the diode D4. The combined bootstrap and charge pump power supply circuit 48C may provide a functionally isolated and/or electrically floating supply voltage VAPSB to the gate driver circuit 40-4 when the gate driver circuit 40-4 is driving the NMOS transistor N4 is the on state as a function of the load voltage VLB when the NMOS transistor N4 is in the off state. The isolated power supply circuit 44 of the augmented power supply circuit 24 may provide power to the combined bootstrap and charge pump power supply circuit 48C while the gate driver circuit 40-4 is driving the NMOS transistor N4 in the on state and to initially charge the capacitor C4 upon startup or reset of the augmented power supply circuit 24 as variously discussed herein.

Transistors included in load driving circuits operated by utilizing the augmented power supply circuit, such as the half bridge circuit 32 of FIGS. 1, 2 and 8 and the single-switch load driving circuits N3, N4 of FIGS. 9 and 10 discussed herein, may be different types of transistors, such as one or more of field effect transistors (FETs) (as depicted in these figures), insulated gate bipolar transistors (IGBTs), bipoloar junction transistors (BJTs) or other types of transistors. Transistors in embodiments of these load driving circuits can also include one or more of NMOS, PMOS, n-channel IGBT, p-channel IGBT, NPN BJT or PNP BJT transistors.

The figures discussed herein are schematic in nature and may omit details and components not directly related to or necessary to explain the aspects of the systems discussed herein.

Additional embodiments of the systems and augmented power supply circuit 24 are possible. For example, any feature of any of the embodiments of the systems and augmented power supply circuit 24 described herein can optionally be used in any other embodiment of the systems and augmented power supply circuit 24. Also, embodiments of the systems and augmented power supply circuit 24 can optionally include any subset or ordering of the components or features of the systems and augmented power supply circuit 24 described herein.

What is claimed is:

1. A power supply circuit to generate a supply voltage for a gate driver circuit, the power supply circuit comprising:
   an isolated power supply circuit to receive a first voltage in a first isolated system and provide power to a cyclic charging power supply circuit, the cyclic charging power supply circuit providing the supply voltage to a gate driver circuit in a second isolated system, the isolated power supply circuit providing the power to the cyclic charging power supply circuit while the gate driver circuit drives a transistor in an on state.

2. The power supply circuit of claim 1, wherein the isolated power supply circuit includes a control circuit to regulate the power provided by the isolated power supply circuit to maintain or increase the supply voltage provided by the cyclic charging power supply circuit while the gate driver circuit drives the transistor in the on state.

3. The power supply circuit of claim 2, wherein the control circuit regulates the provided power by limiting a current supplied to the cyclic charging power supply circuit to a current level below a predetermined level.

4. The power supply circuit of claim 2, wherein the control circuit regulates the provided power by limiting the supply voltage to a voltage at a predetermined voltage level below a peak supply voltage level provided by the cyclic charging power supply circuit.

5. The power supply circuit of claim 2, wherein the control circuit regulates the provided power by limiting the provided power to below a predetermined power level.

6. The power supply circuit of claim 2, wherein the control circuit regulates the provided power by limiting the provided power as a function of a temperature of the isolated power supply.

7. The power supply circuit of claim 2, wherein the control circuit regulates the provided power by selecting an impedance connecting the isolated power supply circuit to the cyclic charging power supply circuit.

8. The power supply circuit of claim 1, further comprising the cyclic charging power supply circuit to receive a second voltage in the second isolated system and provide the supply voltage to the gate driver circuit, the supply voltage being electrically floating relative to the second voltage while the gate driver circuit drives the transistor in the on state.

9. The power supply circuit of claim 1, wherein the cyclic charging power supply circuit is a bootstrap power supply circuit including a capacitor connected to a second voltage via at least a diode.

10. The power supply circuit of claim 9, wherein the isolated power supply circuit provides the power to initially charge the capacitor of the bootstrap power supply circuit upon startup or reset of the power supply circuit.

11. The power supply circuit of claim 10, wherein the isolated power supply circuit provides the power to initially charge the capacitor of the bootstrap power supply circuit while gate driver circuits are inactive.

12. A method of generating a supply voltage for a gate driver circuit, the method comprising:
    receiving, by an isolated power supply circuit, a first voltage in a first isolated system; and
    providing, by the isolated power supply circuit, power to a cyclic charging power supply circuit, the cyclic charging power supply circuit providing a supply voltage to a gate driver circuit in a second isolated system, the isolated power supply circuit providing the power to the cyclic charging power supply circuit while the gate driver circuit drives a transistor in an on state.

13. The method of claim 12, further comprising regulating, by a control circuit of the isolated power supply circuit, the power provided by the isolated power supply circuit to maintain or increase the supply voltage provided by the cyclic charging power supply circuit while the gate driver circuit drives the transistor in the on state.

14. The method of claim 13, wherein the control circuit regulates the provided power by limiting a current supplied to the cyclic charging power supply circuit to a current level below a predetermined level.

15. The method of claim 13, wherein the control circuit regulates the provided power by limiting a voltage provided by the isolated power supply circuit to a voltage at a predetermined voltage level below a peak supply voltage level provided by the cyclic charging power supply circuit.

16. The method of claim 13, wherein the control circuit regulates the provided power by limiting the provided power to below a predetermined power level.

17. The method of claim 13, wherein the control circuit regulates the provided power by limiting the provided power as a function of a temperature of the isolated power supply.

18. The method of claim 13, wherein the control circuit regulates the provided power by selecting an impedance connecting the isolated power supply circuit to the cyclic charging power supply circuit.

19. The method of claim 12, further comprising:
    receiving, by the cyclic charging power supply circuit, a second voltage in the second isolated system; and
    providing, by the cyclic charging power supply circuit, the supply voltage to the gate driver circuit, the supply voltage being electrically floating relative to the second voltage while the gate driver circuit drives the transistor in the on state.

20. The method of claim 19, wherein the cyclic charging power supply circuit includes a bootstrap power supply circuit having a capacitor connected to the second voltage via at least a diode.

21. A power supply circuit to generate a supply voltage for a gate driver circuit, the power supply circuit comprising:
    means for providing power to a cyclic charging power supply circuit, the cyclic charging power supply circuit providing the supply voltage to a gate driver circuit in a second isolated system, the means for providing power providing the power as a function of a received first voltage in a first isolated system and while the gate driver circuit drives a transistor in an on state; and means for regulating the provided power to maintain or increase the supply voltage provided by the cyclic charging power supply circuit while the gate driver circuit drives the transistor in the on state.

22. The power supply circuit of claim 21, further comprising the cyclic charging power supply circuit to receive a second voltage in the second isolated system and provide the supply voltage to the gate driver circuit, the supply voltage being electrically floating relative to the second voltage while the gate driver circuit drives the transistor in the on state.

* * * * *